Figure 1:
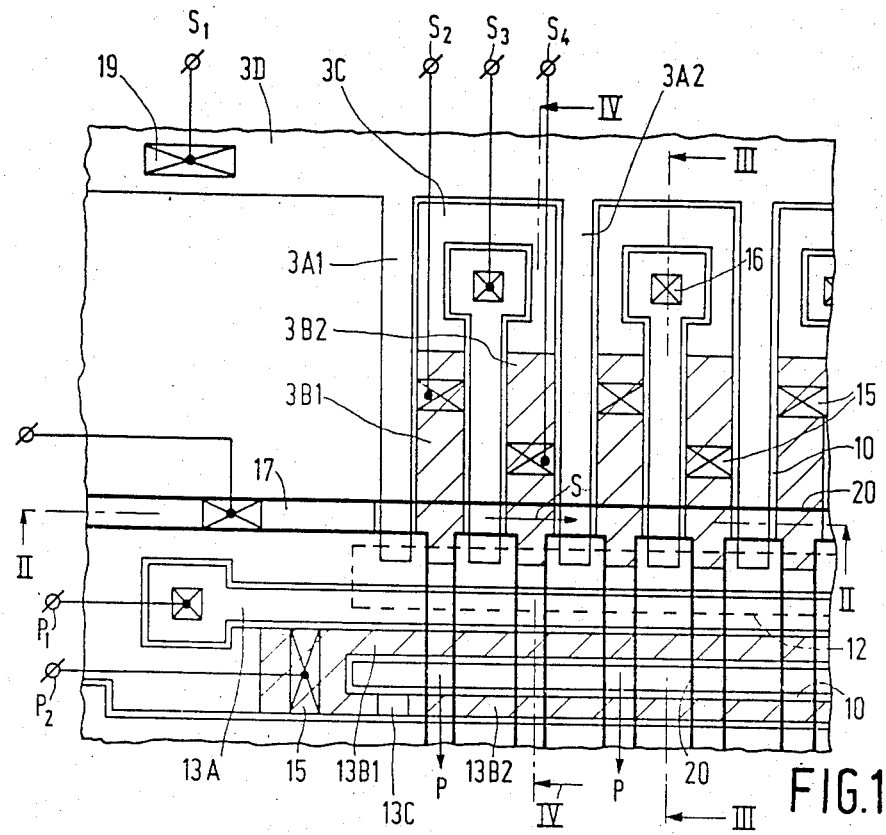

United States Patent [19]

Slotboom et al.

[11] Patent Number: 4,636,826
[45] Date of Patent: Jan. 13, 1987

[54] CHARGE COUPLED DEVICES HAVING NARROW COPLANAR SILICON ELECTRODES

[75] Inventors: Jan W. Slotboom; Henricus G. R. Maas; Johannes A. Appels; François M. Klaassen, all of Eindhoven, Netherlands

[73] Assignee: U.S. Philips Corporation, New York, N.Y.

[21] Appl. No.: 802,499

[22] Filed: Nov. 27, 1985

Related U.S. Application Data

[62] Division of Ser. No. 657,631, Oct. 4, 1984, Pat. No. 4,574,468.

[30] Foreign Application Priority Data

Jan. 25, 1984 [NL] Netherlands ............... 8400224

[51] Int. Cl.⁴ ............... H01L 29/78; H01L 29/04
[52] U.S. Cl. ............... 357/24; 357/59
[58] Field of Search ............... 357/24, 59

[56] References Cited

U.S. PATENT DOCUMENTS 4,055,885 11/1977 Takemoto ............... 357/24
4,063,992 12/1977 Hosack ............... 357/24
4,352,237 10/1982 Widmann ............... 357/24

Primary Examiner—Gene M. Munson
Attorney, Agent, or Firm—Paul R. Miller

[57] ABSTRACT

In a semiconductor device, for example a SPS memory having narrow coplanar silicon electrodes, the electrodes are formed by etching grooves or slots having a width in the submicron range into a polycrystalline silicon layer with the slot width being defined by the oxidized edge of a silicon auxiliary layer. The electrodes are alternately covered by silicon oxide and by a layer comprising silicon nitride. The covered electrodes are first interconnected pairwise, whereupon they are separated from each other, and are provided with self-aligned contact windows. Thus, the very narrow electrodes can be contracted without technological problems and memory cells of very small dimensions are provided.

4 Claims, 24 Drawing Figures

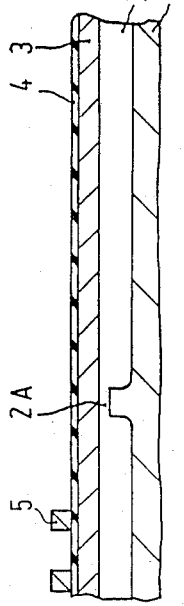 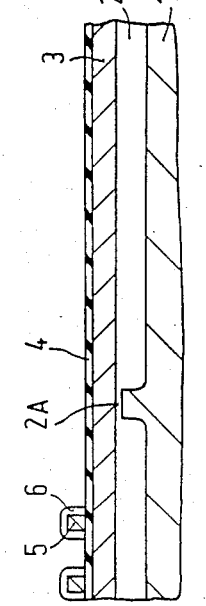 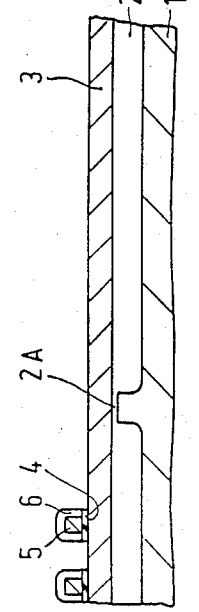 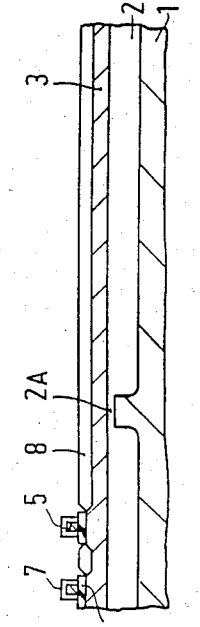
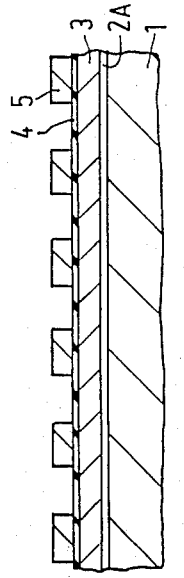 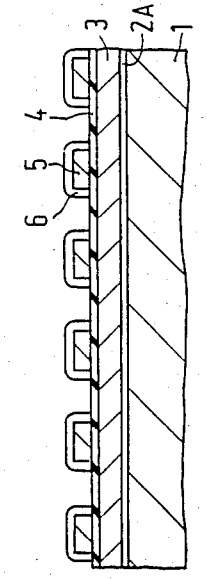 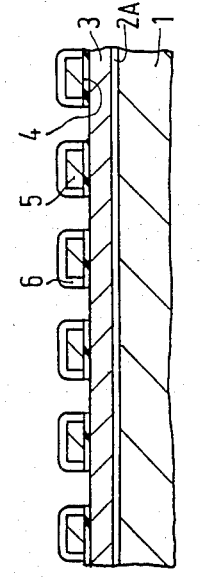 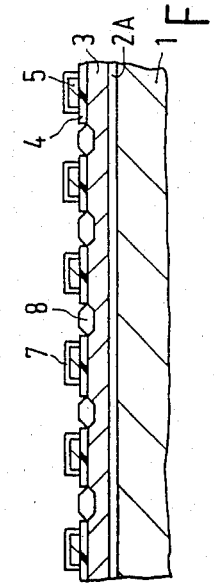

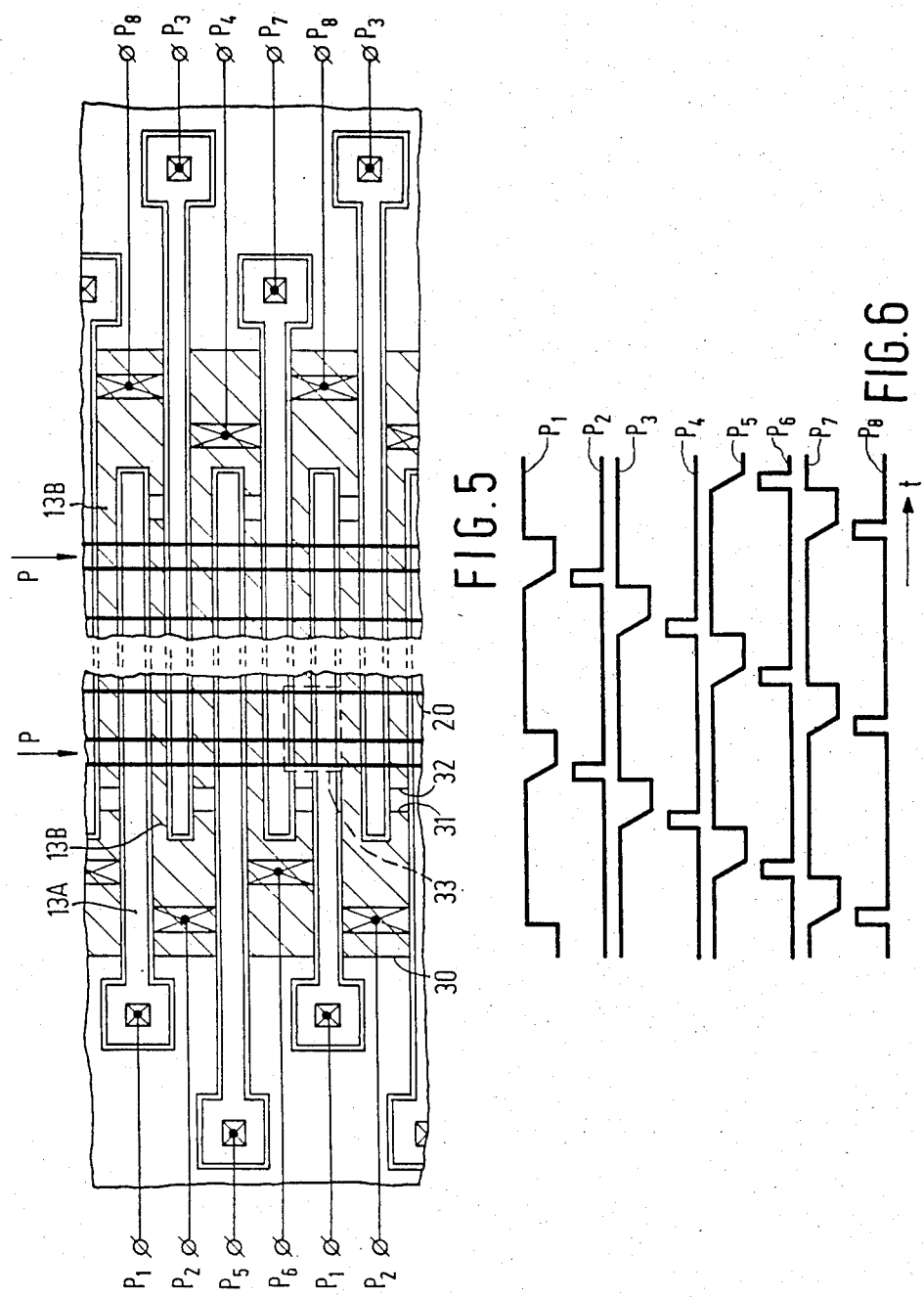

CHARGE COUPLED DEVICES HAVING NARROW COPLANAR SILICON ELECTRODES

This application is a divisional application of Ser. No. 657,631, filed Oct. 4, 1984, now U.S. Pat. No. 4,574,468, and the benefits of such earlier application are claimed for this division.

The invention relates to a method of manufacturing a semiconductor device comprising a plurality of adjacent narrow and closely spaced coplanar silicon electrodes in which on an electrically insulating layer there are deposited successively a first silicon layer an oxidation-preventing layer and a second silicon layer, after which the second silicon layer is etched in a pattern comprising a plurality of parallel silicon strips whereupon this silicon pattern is partly oxidized and the uncovered parts of the oxidation-preventing layer are then removed by etching, after which the oxide present is etched away, the second silicon layer and the uncovered parts of the first silicon layer are thermally oxidized, the uncovered parts of the oxidation-preventing layer are removed by selective etching and a pattern comprising parallel silicon electrodes separated by grooves is formed by etching away the subjacent parts of the first silicon layer.

The invention further relates to a semiconductor device manufactured by means of the method.

A method of the kind described above is known from the published British Patent Application No GB-A 2,111,304 corresponding to U.S. Pat. No. 4,449,287. This Application describes the manufacture of a charge-coupled (CCD) semiconductor device, in which in a self-registered manner control electrodes of silicon are formed, whose very small spacing of, for example, less than 1 μm is determined by lateral oxidation of a silicon pattern.

In this manner, overlapping control electrodes and hence a double-layer electrode system can be avoided, which has great advantages in technological and electrical respect.

However, problems often arise when contacting a large number of very narrow and closely spaced electrodes. Since it is difficult to provide contacts on very narrow electrodes, the electrodes can be made to extend at one or both ends outwardly in the form of a fan, but this requires space. Furthermore, the silicon electrodes have to be provided in mutually separated groups, for which purpose interruptions will have to be formed in the first silicon layer. According to the method described in GB-A No. 2,111,304, this is effected in that at the areas at which there must not be present a silicon layer in the finished device, the second silicon layer is converted already at the beginning of the process throughout its thickness into silicon oxide. However, this requires an additional masking and oxidation step. The interruptions in the first silicon layer then are formed automatically during the processing step in which the grooves are formed between the strip-shaped silicon electrodes.

The invention has inter alia for its object to provide a method in which the problems are avoided and in which a monolayer electrode configuration of high density can be obtained without an additional mask.

The invention is based inter alia on the recognition of the fact that this can be achieved in that the interruptions are provided in the first silicon layer during a processing step other than that in which the grooves are formed between the silicon electrodes.

According to the invention, a method of the kind described in the opening paragraph is characterized in that at least two of the so formed silicon electrodes which are covered by the oxidation-preventing layer are interconnected by means of a part of the first silicon layer, in that this connection is interrupted by a masking and etching step, in that the uncovered parts of the first silicon layer are thermally oxidized until the grooves are entirely filled at least in part with oxide and in that by selectively locally etching the oxidation preventing layer contact windows are formed on the underlying silicon electrodes.

In the method according to the invention, no local oxidation of the second silicon layer is necessary before patterning this layer so that at the beginning of the process a masking and oxidation step is avoided. Furthermore, when the grooves are oxidized at the end of the process a part of the contact windows can be provided in a self-aligned manner at least in one direction by selectively etching away the oxidation-preventing layer, as will be described in detail hereinafter. As a result, inter alia memory cells having very small dimensions can be obtained.

According to a preferred embodiment, the first silicon layer used is a highly doped layer and the second silicon layer used is a considerably more weakly doped layer. The difference in rate of oxidation between the highly doped silicon layer oxidizing more rapidly and the more weakly doped second silicon layer oxidizing more slowly can then be utilized in a suitable manner. The highly doped first layer is for this purpose preferably n-type conducting and has a doping concentration of at least $2 \times 10^{20}$ donor atoms/cm$^3$.

According to another preferred embodiment, in which it is not necessary for a difference in rate of oxidation to exist between the first and the second silicon layer, the second silicon layer is thinner than the first silicon layer and a second oxidation-preventing layer is formed on the second silicon layer, as a result of which the pattern formed from the second silicon layer is partly oxidized only at the edge of this layer, after which the second oxidation-preventing layer is removed. Subsequently, the second silicon layer is preferably converted entirely and the first silicon layer is converted only in part into oxide, whereupon the oxide formed from the second silicon layer is removed by a dip-etching step, the oxide formed on the first silicon layer remaining partly in tact.

The oxidation-preventing layers used preferably comprise silicon nitride and consist, for example, of silicon oxynitride or silicon nitride.

The invention further relates to a semiconductor device manufactured by the use of the method described. The invention more particularly relates to a field effect device having a plurality of adjacent gate electrodes in the form of narrow coplanar silicon strips which are formed from a single silicon layer and which alternately belong to a first group covered by silicon oxide and to a second group covered by an insulating layer comprising silicon nitride, the gate electrodes being separated from each other by the silicon oxide covering the first group, and the gate electrodes of the second group being formed by separating originally pairwise coherent silicon strips, wherein the gate electrodes are contacted via contact windows, and the contact windows of the gate electrodes of the second group in the direction of the charge transport are bounded by the silicon oxide covering the gate electrodes of the first group.

The invention is of particular importance in the case in which the semiconductor device is a series/parallel/series (SPS) memory. Due to the compact construction, very small memory cells, for example of less than 20 $\mu m^2$ surface area or even smaller, can be obtained.

Figure 2:
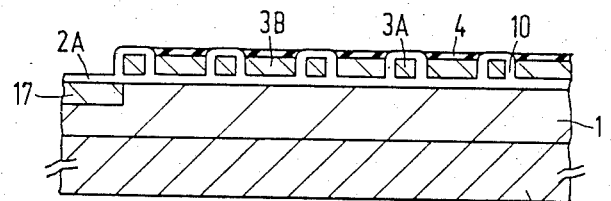
Figure 3:
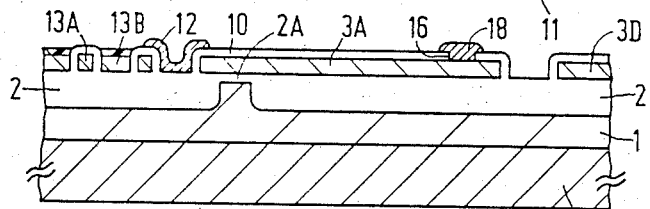
Figure 4:
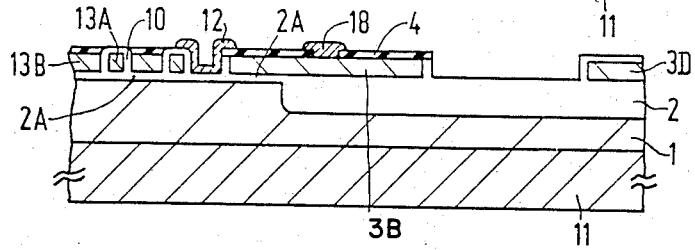

The invention will now be described more fully with reference to an embodiment and the drawing, in which:

FIG. 1 is a plan view of a part of a semiconductor device manufactured using the method according to the invention, FIG. 2 shows diagrammatically a cross-sectional view of the device of FIG. 1 taken on the line II—II, FIG. 3 shows diagrammatically a cross-sectional view of the device of FIG. 1 taken on the line III—III, FIG. 4 shows diagrammatically a cross-sectional view of the device of FIG. 1 taken on the line IV—IV, FIGS. 2A to 2F and 3A to 3F show successive stages in the manufacture of the device of FIG. 1 in cross-sectional views taken on the lines II—II and III—III, respectively, FIG. 5 is a plan view of another part of the device of FIG. 1, FIG. 6 shows diagrammatically the variation of the clock voltages of the parallel register of the device shown in FIG. 1, and FIGS. 7A to F show diagrammatically in cross-sectional view successive stages in the manufacture of the device shown in FIG. 1 according to a variation of the method in accordance with the invention.

The Figures are purely schematic and not drawn to scale. Corresponding parts are generally denoted by the same reference numerals.

FIG. 1 shows in plan view and FIGS. 2, 3 and 4 show in cross-sectional views taken on the lines II—II, III—III and IV—IV of FIG. 1 a part of a semiconductor device manufactured by means of the method according to the invention. The semiconductor device in this example is a charge-coupled device, also designated as CCD, which has the form of a so-called SPS (Series/Parallel/Series) memory. It consists of a series register (designated by the arrow S) controlled by a number of strip-shaped silicon electrodes 3A, B located on a thin insulating layer 2A, and can displace charge carriers in a subjacent silicon region 1 along the surface according to the arrow S along the line II—II. The contents of this series register can be transferred in a usual manner by means of the gate electrodes 13A,B to a second series register (not shown) which extends parallel to S and from which the information originally stored in S can be read. The shift registers S and P are located inside a sunken oxide pattern 2 (in FIG. 1 limited by the line 20).

This semiconductor device is manufactured in accordance with the invention in the manner indicated in FIGS. 2A to 2F and 3A to 3F for the cross-sections taken on the lines II—II and III—III, respectively.

The starting material is a semiconductor substrate, in this example constituted by a p-type conducting silicon layer 1 having, for example, a thickness of 5 $\mu m$ and a doping concentration of $5 \times 10$ atoms/cm$^3$, which is grown epitaxially on a highly doped p-type silicon substrate 11. In known manner, a countersunk pattern 2 of silicon oxide (limited in FIG. 1 by the line 20) having a thickness of about 0.5 $\mu m$ is provided in the layer 1 by local selective oxidation, while the silicon layer 1 is covered outside this countersunk pattern 2 by an oxide layer 2A having, for example, a thickness of 50 nm (see FIGS. 2-4, 2A and 3A).

In known manner, there are deposited successively on the insulating layer (2,2A) a first silicon layer 3, an oxidation-preventing layer 4 (in this example a silicon nitride layer) and a second silicon layer 5. The layer 4 may also consist of another material comprising silicon nitride, for example silicon oxynitride. The silicon layers are mostly deposited in the form of a polycrystalline layer.

In this example the first silicon layer 3 is a 0.5 $\mu m$ thick n-type layer having a doping concentration of $7 \times 10^{20}$ atoms/cm$^3$. Its doping can be effected either simultaneously with the deposition or after this step by means of diffusion or ion implantation.

In this example, the second silicon layer 5 is undoped, that is to say that it is not doped intentionally, and has a thickness of 0.7 $\mu m$. The layer 5 is an auxiliary layer, which is removed at the end of the process.

In a usual manner, by masking and etching, the second silicon layer 5 is given a pattern which comprises a number of parallel silicon strips separated from each other by strip-shaped interstices (see FIGS. 2A and 3A). The longitudinal direction of these strips is at right angles to the plane of the drawing.

Subsequently, this silicon pattern is partly oxidized, an oxide layer 6 being formed in this process (see FIGS. 2B and 3B). This oxidation may be carried out, for example, in wet oxygen at a temperature of 1000° C. for 3 hours. The oxide layer 6 then has a thickness of about 0.5 $\mu m$.

Subsequently, the uncovered parts of the silicon nitride layer 4 are removed by etching. This may be effected, for example, in hot concentrated phosphoric acid or by plasma-etching (see FIGS. 2C and 3C).

The oxide 6 present is then etched away. Thereafter the second silicon layer 5 and the now uncovered parts of the first silicon layer 3 are thermally oxidized. A thick oxide layer 8 is formed on the highly doped silicon layer 3, while a considerably thinner oxide layer 7 is formed on the substantially undoped silicon layer 5 (see FIGS. 2D and 3D).

Subsequently, this thin oxide layer 7 is removed by a dip-etching step. By selective etching in, for example, hot phosphoric acid, the uncovered parts of the silicon nitride layer 4 are now removed. Thereafter, a pattern comprising parallel silicon electrodes 3A, B; 13A, B separated by grooves 14 is formed by etching away the subjacent parts of the first silicon layer 3. Moreover, the remaining parts of the second silicon layer 5 are removed. Thus, the structure of FIGS. 2E and 3E is obtained, in which the electrodes 3A, 13A are covered by oxide and the electrodes 3B, 13B are covered by nitride.

According to the invention, after this operation, at least two silicon electrodes 3B1, 3B2 and 13B1, 13B2, respectively, covered by silicon nitride are still interconnected by a part 3C,13C of the first silicon layer 3 (see FIG. 1).

Figure 3E:
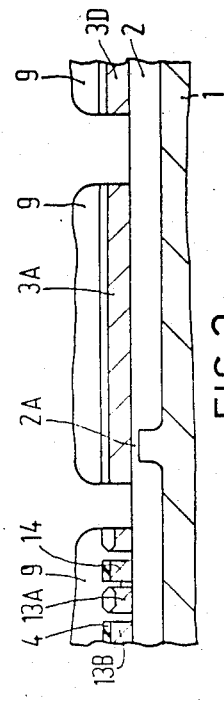
Figure 3F:
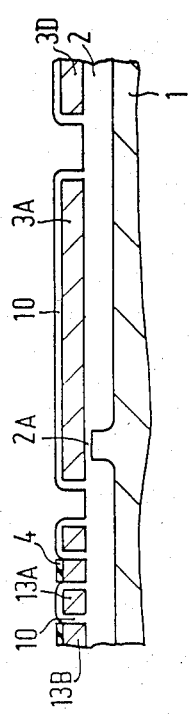
Figure 2E:
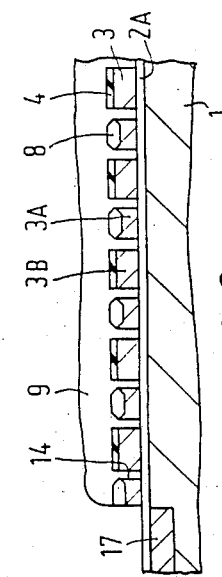
Figure 2F:
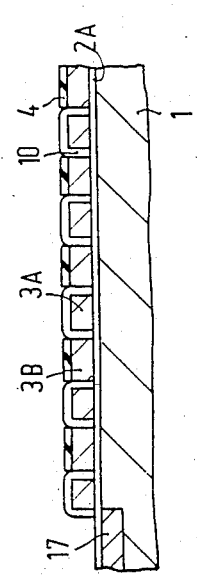

In order to interrupt these connections 3C, 13C, a photolacquer mask 9 is now provided (see FIGS. 2E and 3E). By etching away the part of the oxide layer 8 left free by this mask and the subjacent silicon layer 3, the connections 3C, 13C are interrupted. Subsequently, in the presence of the photolacquer mask 9, the desired n-type source and drain zones 17 are implanted at the unmasked areas not occupied by the countersunk oxide pattern 2 (see FIGS. 1, 2E and 2F). The mask 9 is then removed and the uncovered parts of the silicon layer 3 are thermally oxidized until the grooves 14 are partly or entirely filled by oxide 10 (FIGS. 2F, 3F). The remaining parts of the silicon electrodes covered by nitride are cross-hatched in the plan views of FIGS. 1 and 5.

The mask 9 defines both the electrode ends and the source and drain zones. Instead of after the formation of the mask 9, the grooves may also be closed by oxidation before this operation.

By selectively locally etching the oxidation-preventing silicon nitride layer 4, contact windows 15 are now formed on the subjacent silicon electrodes 3B, 13B (see FIGS. 1 and 4). In the plan views, the contact windows are indicated by diagonal lines. Since the contact windows 15 are limited in the direction of the arrow S (FIG. 1) by the oxide 10, they can be provided in a self-aligned manner at least in that direction.

Contact windows (16) are also formed on a part of the silicon electrodes 3A covered by oxide 10. However, a sufficient amount of space is available for this purpose in the widened end of the electrodes 3A so that these contact windows can be provided without self-alignment.

Via the contact windows, the silicon electrodes 3A and 3B are then connected to conductor tracks 18, which can be connected to the desired gate voltage. For the sake of simplicity, these conductor tracks (see FIGS. 3 and 4) are omitted in the plan views of FIGS. 1 and 5.

Electrodes that have to be connected to the same gate or clock voltage, are preferably interconnected. For one group of such electrodes, the silicon layer 3 itself can be used for this purpose. In this example, this is the case for the electrodes 3A1, 3A2 etc., which (see FIG. 1) are interconnected by the part 3D of the silicon layer 3, which part is provided with a connection conductor in the contact window 19.

In order to be able to transfer the charges from the series register S to the parallel registers P, a transfer electrode 12 is provided between S and P. This electrode, which may be made, for example, of aluminium, is the only electrode which is not formed from the first silicon layer 3.

The series register S is suitable with the electrode configuration of this example to be controlled with four clock voltages $S_1$, $S_2$, $S_3$ and $S_4$, which are applied to the electrodes, as is indicated diagrammatically in FIG. 1.

The parallel registers P have an electrode configuration as shown in part in plan view in FIG. 5. A high charge density can be attained when the drive is effected, as in this example, in eight phases with clock voltages $P_1$ to $P_8$, which are connected as shown in FIG. 5, with four "storage" electrodes ($P_1$, $P_3$, $P_5$, $P_7$) and four "transfer" electrodes ($P_2$, $P_4$, $P_6$, $P_8$). Half the number of electrodes is connected on the lefthand side and the other half is connected to the righthand side of the parallel registers P. The cross-hatched silicon electrodes covered by silicon nitrides are separated from each other by interruptions at the boundaries 30, 31 and 32, which interruptions are formed during the processing step shown in the cross-sections of FIGS. 2F and 3F.

The information supplied by the parallel registers P is read out by a series register provided at the other end of these registers. This series register may have the same construction as the series register S and is not shown here further.

When in the structure described use is made of silicon strips having a width of, for example, 1.5 μm, memory cells having a surface area of 9 μm² can be obtained (see the dotted rectangle 33 in FIG. 5). The clock voltages used for operating the parallel registers P are shown diagrammatically in FIG. 6 as a function of the time t.

The device described above may also be manufactured without using silicon layers having greatly different doping concentrations. However, this requires a second oxidation-preventing layer. FIGS. 7A to 7E show successive stages of such a manufacture, the cross-sections being taken on the same plane II—II as those of FIGS. 2 and 2A to 2F.

There are now provided on the oxide layer 2A and the countersunk oxide pattern 2 (not lying in the cross-section of FIG. 7) a first silicon layer 3, a first oxidation-preventing layer 4, a second silicon layer 5 and a second oxidation-preventing layer 40. The layers 4 and 5 can again both consist of silicon nitride and the doping concentrations of the layers 3 and 5 need not be different. However, it is required that the layer 5 is thinner than the layer 3.

By means of a first masking and etching step, the layers 5 and 40 are patterned (see FIG. 7A); this situation corresponds to that of FIG. 2A. Subsequently (see FIG. 7B), the silicon pattern obtained is converted by thermal oxidation at the edge into oxide 6. The nitride layer 40 and the exposed parts of the nitride layer 4 are etched away without a mask (see FIG. 7C).

Figure 7A:
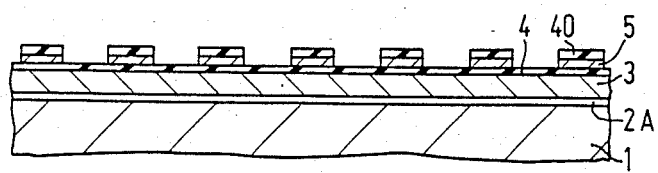
Figure 7B:
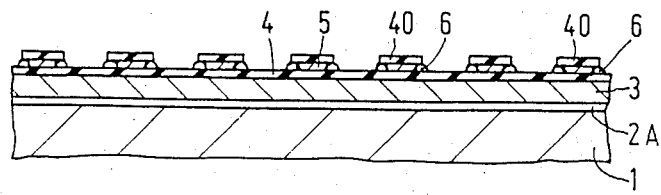
Figure 7C:
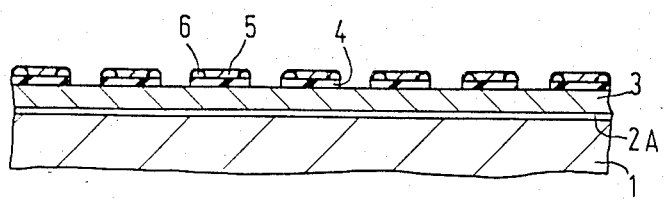
Figure 7D:
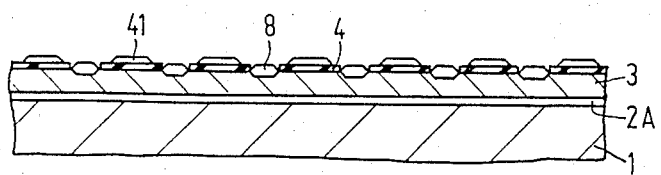
Figure 7E:
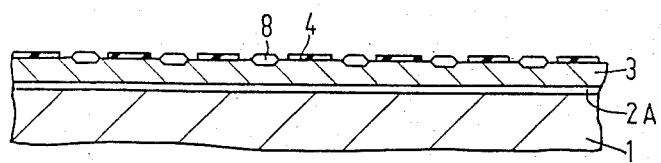
Figure 7F:
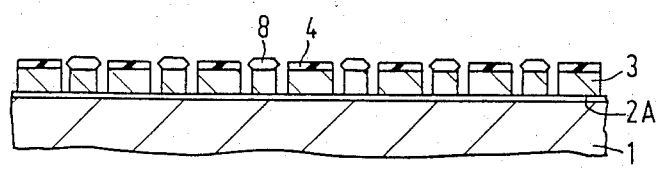

After etching away the oxide edges 6, the silicon of the layer 5 is converted entirely by thermal oxidation into oxide 41, oxide layers 8 being formed on the exposed parts of the layer 3 (see FIG. 7D). The silicon layer 5 must be so thin that the oxide layer 41 formed therefrom is considerably thinner than the oxide layer 8. By selective etching, uncovered parts of the silicon nitride layer 4 are now removed, after which the oxide layer 41 are etched away by a dip-etching step. A part of the oxide layers 8 is then maintained (see FIG. 7E). Subsequently, grooves are etched into the silicon layer 3 down to the oxide layer 2A (FIG. 7F). Since the same situation as in FIG. 2E is now obtained, the method can be accomplished in the same manner as in the preceding example (FIGS. 2E and 2F).

It will be appreciated that the invention is not limited to the embodiments shown herein, but that many variations are possible without departing from the scope of the invention. In particular, the invention may also be used in the manufacture of semiconductor devices other than CCD's. Furthermore, the layer 2A may consist of an insulating material other than silicon oxide, while the oxidation-preventing layers may have a composition other than that mentioned here. Of course, the clock and gate voltages required for controlling CCD's or SPS memories according to the invention may be varied according to desire by those skilled in the art.

What is claimed is:

1. A semiconductor device characterized in that the device is a field effect device having a plurality of adjacent gate electrodes in the form of narrow coplanar silicon strips which are formed from a single silicon layer and alternately belong to a first group covered by silicon oxide and to a second group covered by an insulating layer comprising silicon nitride, the gate electrodes being separated from each other by the silicon oxide covering the first group and the gate electrodes of the second group being formed by separating originally pair-wise coherent silicon strips, wherein the gate electrodes are contacted via contact windows and the contact windows of the gate electrodes of the second group in the direction of the charge transport are bounded by the silicon oxide covering the gate electrodes of the first group.

2. A semiconductor device as claimed in claim 1, characterized in that the field effect device is a charge-coupled device (CCD).

3. A semiconductor device as claimed in claim 2, characterized in that the device is a series/parallel/series (SPS) memory.

4. A semiconductor device as claimed in claim 2, characterized in that the electrodes are connected to one of the clock voltages and are interconnected by a part of said silicon layer.

* * * * *